(12) United States Patent
Fornara et al.

(10) Patent No.: US 12,021,074 B2
(45) Date of Patent: Jun. 25, 2024

(54) INTEGRATED CIRCUIT INCLUDING A CAPACITIVE STRUCTURE OF THE METAL-INSULATOR-METAL TYPE AND CORRESPONDING MANUFACTURING METHOD

(71) Applicant: STMicroelectronics (Rousset) SAS, Rousset (FR)

(72) Inventors: Pascal Fornara, Pourrieres (FR); Roberto Simola, Trets (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 17/516,920

(22) Filed: Nov. 2, 2021

(65) Prior Publication Data

US 2022/0139899 A1 May 5, 2022

(30) Foreign Application Priority Data

Nov. 3, 2020 (FR) ...................................... 2011274

(51) Int. Cl.
*H01L 29/40* (2006.01)
*H01L 21/70* (2006.01)
*H01L 27/01* (2006.01)
*H10B 41/41* (2023.01)
*H10B 41/42* (2023.01)

(52) U.S. Cl.
CPC .......... *H01L 27/016* (2013.01); *H01L 21/707* (2013.01); *H10B 41/41* (2023.02); *H10B 41/42* (2023.02)

(58) Field of Classification Search
CPC . H01L 27/016; H01L 21/707; H01L 27/0682; H01L 27/0805; H01L 28/90; H01L 28/75; H01L 29/945; H10B 41/41; H10B 41/42
See application file for complete search history.

(56) References Cited

U.S. PATENT DOCUMENTS 8,619,464 B1 * 12/2013 Sinha ....................... G11C 7/02
365/189.14
10,784,267 B1 9/2020 Chao
(Continued)

FOREIGN PATENT DOCUMENTS

EP 2999002 A1 3/2016
EP 3493284 A1 6/2019

OTHER PUBLICATIONS

INPI Search Report and Written Opinion for FR Appl. No. 2011274, which is the priority French filing for the instant US filing, dated Jul. 19, 2021 (9 pages).

*Primary Examiner* — Samuel Park
(74) *Attorney, Agent, or Firm* — Crowe & Dunlevy LLC

(57) ABSTRACT

An integrated circuit includes a semiconductor substrate, a conductive layer above a front face of the substrate, a first metal track in a first metal level, and a pre-metal dielectric region located between the conductive layer and the first metal level. A metal-insulator-metal-type capacitive structure is located in a trench within the pre-metal dielectric region. The capacitive structure includes a first metal layer electrically connected with the conductive layer, a second metal layer electrically connected with the first metal track, and a dielectric layer between the first metal layer and the second metal layer.

17 Claims, 10 Drawing Sheets

(56) References Cited

U.S. PATENT DOCUMENTS

| | | | |
|---|---|---|---|
| 2003/0203633 A1* | 10/2003 | Sinha | H01L 21/3212 |
| | | | 438/692 |
| 2009/0244971 A1* | 10/2009 | Lee | H10B 41/30 |
| | | | 365/185.08 |
| 2010/0148304 A1* | 6/2010 | Rahim | H01L 27/0805 |
| | | | 257/532 |
| 2013/0043557 A1 | 2/2013 | Cho | |
| 2013/0093045 A1 | 4/2013 | Cho | |
| 2015/0076657 A1 | 3/2015 | Chou et al. | |
| 2016/0071850 A1* | 3/2016 | Sakamoto | H01L 21/28556 |
| | | | 438/381 |
| 2022/0336346 A1 | 10/2022 | Zhu et al. | |

* cited by examiner

INTEGRATED CIRCUIT INCLUDING A CAPACITIVE STRUCTURE OF THE METAL-INSULATOR-METAL TYPE AND CORRESPONDING MANUFACTURING METHOD

PRIORITY CLAIM

This application claims the priority benefit of French Application for Patent No. 2011274, filed on Nov. 3, 2020, the content of which is hereby incorporated by reference in its entirety to the maximum extent allowable by law.

TECHNICAL FIELD

Embodiments and implementations relate to integrated circuits and, in particular, to capacitive elements of integrated circuits.

BACKGROUND

A major need for embodiments of capacitive elements is to have the highest possible capacitive value per surface unit, referred to as "surface capacity".

To increase the surface capacity of capacitive structures of the Metal Oxide Semiconductor (MOS) type, it has been proposed to form the conductive electrode by filling trenches extending vertically deep into the semiconductor substrate.

Increasing the depth of the trenches allows to increase the surface capacity, but this approach is limited on the one hand by the etching time of the trenches directly proportional to the depth of the trenches, and on the other hand the tool used to etch deep trenches is not necessarily provided in given production lines, and its integration into a production line can represent a significant cost.

Thus, it is desirable to increase the surface capacity of the capacitive elements, according to techniques that are not very restrictive and are compatible with integrated circuit production chains providing for etching trenches which are limited in depth.

SUMMARY

According to one aspect, provision is made in this regard of an integrated circuit including a semiconductor substrate, a conductive layer above a front face of the substrate, a first metal track in a first metal level, a pre-metal dielectric region located between the conductive layer and the first metal level, and at least one capacitive structure called metal-insulator-metal-type capacitive structure located in the volume of the pre-metal dielectric region. The capacitive structure of the metal-insulator-metal type comprises a first metal layer configured to be electrically connected with the conductive layer, a second metal layer configured to be electrically connected with the first metal track, and a dielectric layer between the first metal layer and the second metal layer.

The capacitive structures will be as metal-insulator-metal (MIM) type, although the capacitive elements usually designated by these terms are not conventionally located at the pre-metal dielectric region, but rather in the last metal levels of the interconnect where the constraints, which are in particular spatial, are different than in the pre-metal dielectric region.

The capacitive structures of the metal-insulator-metal type located in the pre-metal dielectric region can consequently undergo spatial stresses determined by the other elements formed on the substrate. Nevertheless, the MIM-type capacitive structures according to this aspect can advantageously be disposed in a free space of the pre-metal dielectric but the underlying substrate surface of which is occupied by another element, such as for example a capacitive element of the MOS type as mentioned above, or else such as a resistive element located in or on the substrate.

Thus, the integration of capacitive structures does not properly occupy any additional surface on the substrate and therefore allows to benefit from an additional capacitive interface and "free" in terms of overall dimension.

According to one embodiment, the conductive layer is made of polycrystalline silicon and comprises a thin layer of metal silicide, and the first metal layer comprises a diffusion barrier layer in chemical bond with the thin layer of metal silicide.

This allows to ensure a good electrical connection between the conductive layer and the first metal layer of each metal-insulator-metal capacitive structure.

According to one embodiment, each capacitive structure of the metal-insulator-metal type is disposed in a trench in the volume of the pre-metal dielectric region, the first metal layer conforming to the sides and the bottom of the trench, the dielectric layer conforming to the sides and the bottom of the first metal layer, the second metal layer conforming to the sides and the bottom of the dielectric layer.

Thus, the layers of metal, insulator and metal of the capacitive structures are arranged in U-shapes nested into each other, and in the length of the trenches, so as to increase the size of the interface between the first and the second conductive layer, and thus increase the capacitive value of each capacitive structure.

According to one embodiment, a dielectric interface electrically insulates the conductive layer and the semiconductor substrate, the conductive layer and the dielectric interface being configured to form, with the semiconductor substrate, a capacitive structure of the metal-oxide-semiconductor type.

Thus, the conductive layer is not only used to electrically connect the first metal layers of the MIM-type capacitive structures, but also to form a MOS-type capacitive structure. Consequently, the surface occupied on the substrate is exploited for the two types of capacitive structures, forming a capacitive element of greater capacitive value with equal overall dimensions.

According to one embodiment, the conductive layer includes a horizontal part covering a surface of the semiconductor substrate and at least one vertical part extending deep into the substrate, perpendicularly to said surface.

This embodiment is advantageous in terms of surface capacity, and in terms of the overall dimension of the electrical connections between the conductive layer and the vertical and horizontal parts of the MOS capacitive structure.

According to one embodiment, the vertical part of the conductive layer has a structure similar to the structure of a vertical gate of a buried access transistor belonging to a memory cell of a non-volatile memory.

In other words, it is proposed to co-integrate the manufacture of the MOS-type capacitive structure with the manufacture of a non-volatile memory, for example of the Electrically Erasable and Programmable Read Only Memory (EEPROM) type, advantageously in terms of costs in particular.

According to one embodiment, the conductive layer is configured to be electrically connected to a second metal track of the first metal level, and the semiconductor substrate is configured to be electrically connected to a third metal track of the first metal level, the second metal track and the third metal track being able to be coupled with each other or with the first metal track.

Thus, depending on the coupling of the metal tracks, it is possible to use only the MIM-type capacitive structure, only the MOS-type capacitive structure, or else the two capacitive structures coupled in parallel, in the same embodiment of the integrated circuit.

According to one embodiment, the conductive layer is located above a resistive conductive bar belonging to a resistive element having two terminals, the first metal track, the conductive layer, and the terminals of the resistive element being coupled so as to form a resistive-capacitive circuit with said at least one capacitive structure of the metal-insulator-metal type.

Again, the MIM-type capacitive structure is free in terms of overall dimension to form an RC circuit at the location of the resistive bar.

According to another aspect, provision is made of an integrated circuit manufacturing method comprising: forming a conductive layer above a front face of a semiconductor substrate; forming a pre-metal dielectric region above the conductive layer; forming at least one capacitive structure called metal-insulator-metal-type capacitive structure in the volume of the pre-metal dielectric region, comprising forming a first metal layer configured to be electrically connected with the conductive layer, forming a dielectric layer on the first metal layer, and forming a second metal layer on the dielectric layer; and forming contacts through the pre-metal dielectric region and forming metal tracks of a first metal level above the pre-metal dielectric region, the contacts being configured to electrically connect the second metal layer with a first metal track of the first metal level.

According to one implementation, the conductive layer is formed of polycrystalline silicon, the formation of the first conductive layer comprising a silicidation forming a thin layer of metal silicide on the conductive layer, and the formation of the first metal layer comprises a formation of a diffusion barrier layer, the method comprising a non-oxidizing annealing step capable of generating a chemical bond between the diffusion barrier layer and the thin layer of metal silicide.

According to one implementation, the formation of each capacitive structure of the metal-insulator-metal type comprises an etching of a trench in the volume of the pre-metal dielectric region, the formation of the first metal layer comprising a conformal deposition conforming to the sides and the bottom of the trench, the formation of the dielectric layer comprising a conformal deposition conforming to the sides and the bottom of the first metal layer, and the formation of the second metal layer comprising an excess deposition conforming to the sides and the bottom of the dielectric layer and a filling of each trench followed by a mechanical-chemical planarization (or Chemical-Mechanical Polishing (CMP)) removing the excess of the second metal layer outside the trenches.

According to one implementation, the formation of the conductive layer comprises a formation of a dielectric interface electrically insulating the conductive layer and the semiconductor substrate, and is configured so that the conductive layer and the dielectric interface form, with the semiconductor substrate, a capacitive structure of the metal-oxide-semiconductor type.

According to one implementation, the formation of the conductive layer comprises an etching of at least one trench extending in the substrate perpendicularly to a surface of the substrate, a filling of said at least one trench with a conductive material overflowing from the trench above a part of said surface, so that the conductive layer includes a horizontal part covering said surface and at least one vertical part extending deep into the substrate perpendicularly to said surface.

According to one implementation, the steps of etching said at least one trench and filling said at least one trench are carried out simultaneously with similar steps of forming a buried access transistor with a vertical gate of a method for manufacturing memory cells of a non-volatile memory.

According to one implementation, the method comprises a formation of contacts being configured to electrically connect the conductive layer with a second metal track of the first metal level, and a formation of contacts being configured to electrically connect the semiconductor substrate with a third metal track of the first metal level, the second metal track and the third metal track being able to be coupled with each other or with the first metal track.

According to one implementation, the method comprises a formation of a resistive conductive bar intended to belong to a resistive element having two terminals, the conductive layer being formed above the resistive conductive bar, the method comprising a coupling of the first metal track, of the conductive layer, and of the terminals of the resistive element so as to form a resistive-capacitive circuit with said at least one capacitive structure of the metal-insulator-metal type.

BRIEF DESCRIPTION OF THE DRAWINGS

Other advantages and features of the invention will become apparent upon examining the detailed description of embodiments and implementations, which are in no way limiting, and of the appended drawings, wherein.

DETAILED DESCRIPTION

Figure 1:
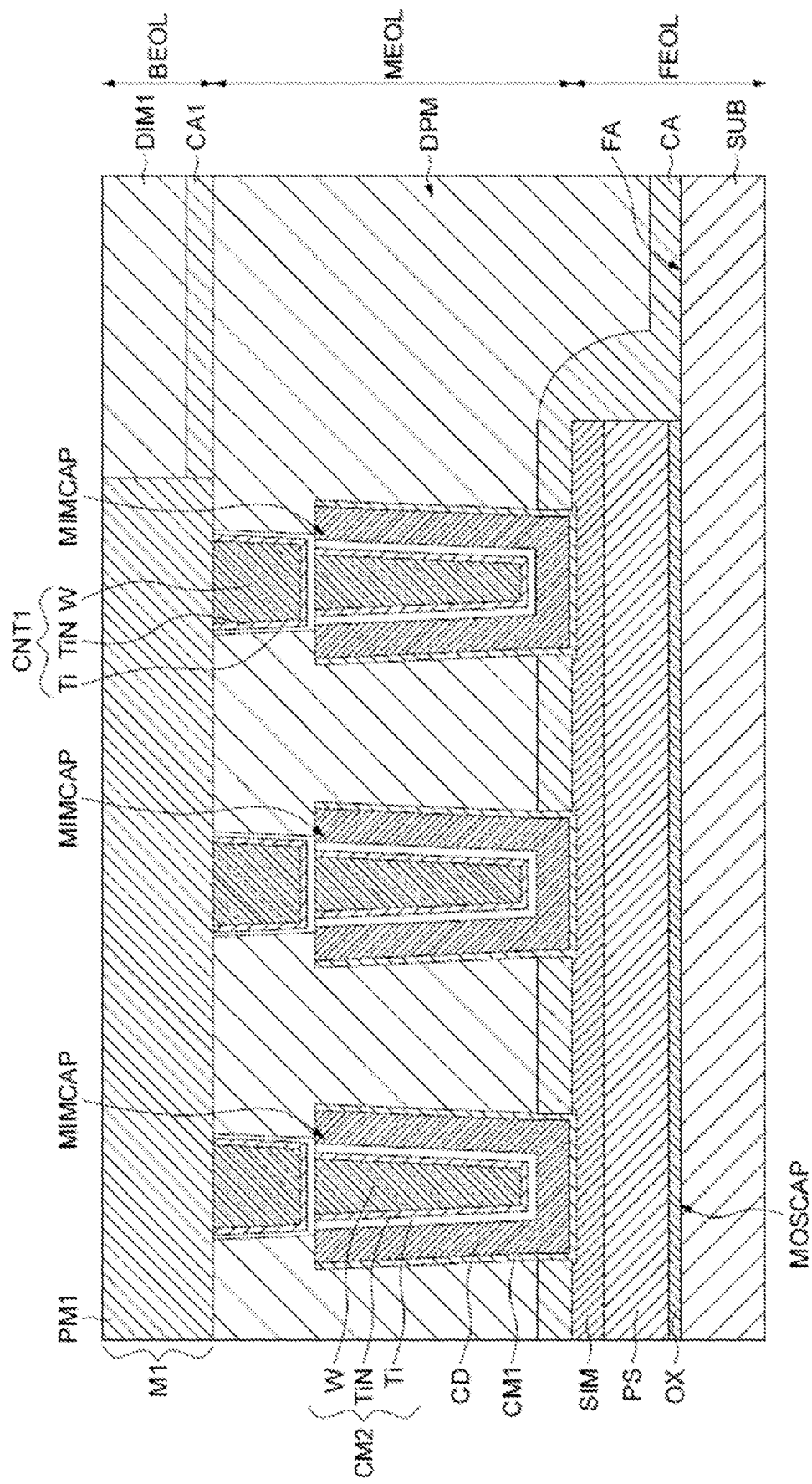
FIG. 1 illustrates an example of an integrated circuit including capacitive structures of the metal-dielectric-metal (MIM) type.

FIG. 1 illustrates an example of an integrated circuit including in particular a semiconductor substrate SUB, typically made of silicon, capacitive structures of the metal-dielectric-metal (MIM) type, and a metal track PM1.

In the following, "capacitive structure(s) of the metal-dielectric-metal type" can be designated directly by reference to the reference sign MIMCAP, that is to say by the terms "capacitive structure(s) MIMCAP".

A Front End Of Line (FEOL) semiconductor part includes the semiconductor substrate SUB and the semiconductor components produced in and on the substrate from a front face FA of the substrate, such as transistors, diodes or MOS-type capacitive elements. The front face FA of the substrate typically defines a horizontal plane, and the vertical is typically oriented with "the bottom" directed towards the volume of the substrate SUB and "the top" directed towards the outside of the front face FA where the components are formed.

A Back End Of Line (BEOL) interconnection part includes a stack of metal levels M1. Each metal level comprises metal tracks PM1 to trace the path of the interconnections, vias to contact the metal tracks of the neighboring metal levels, and inter-metal dielectric layers DIM1, CA1 electrically insulating the metal tracks from the neighboring metal levels. The last interconnection levels are typically intended for the packaging of the integrated circuit packages.

The Middle End Of Line (MEOL) part located between the semiconductor part FEOL and the interconnection part BEOL includes a dielectric region DPM, usually called a pre-metal dielectric, to electrically separate and insulate the structures formed in the semiconductor part FEOL and the first metal level M1 of the interconnection part BEOL. Typically, metal contacts vertically pass through the pre-metal dielectric layer DPM to connect the components of the semiconductor part FEOL with a metal track of the first metal level M1.

The pre-metal dielectric layer DPM is, for example, made of phosphosilicate glass or optionally of silicon dioxide. A stop layer AC, belonging to the pre-metal dielectric region DPM, may be provided at the semiconductor part FEOL to stop the etching of the contact formation.

The capacitive structures MIMCAP are located in the part MEOL, in the volume of the pre-metal dielectric region DPM.

The capacitive structures MIMCAP comprise a superposition of a first metal layer CM1, a dielectric layer CD and a second metal layer CM2.

The first metal layer CM1 of each capacitive structure MIMCAP is electrically connected with a conductive layer PS belonging to the semiconductor part FEOL. In this example, the conductive layer PS is located on the front face FA of the semiconductor substrate SUB.

The second metal layer CM2 of each capacitive structure MIMCAP is electrically connected with the first metal track PM1 via a contact CNT1.

The thickness of the dielectric layers CD, located between the first metal layer CM1 and the second metal layer CM2 of each capacitive structure MIMCAP, allows in particular to set the capacitive value of the capacitive structures MIMCAP.

As will appear below in relation to FIGS. 2 to 9 or FIGS. 10 to 13, a trench (TRDPM) is opened in the volume of the pre-metal dielectric region DPM to accommodate the capacitive structures MIMCAP. The trenches have a shape which is narrow in width (horizontally in the view of FIG. 1), elongated in length (perpendicularly to the view of FIG. 1), and have a depth (vertically in the view of FIG. 1) intended to allow the formation of contacts CNT1 between the top of the capacitive structures MIMCAP and the first metal level M1.

The trenches are formed so as to have the greatest possible density. The lateral space between two trenches can also be made as small as possible in this regard.

The capacitive structures MIMCAP are thus arranged in parallel bars, spaced laterally and extending longitudinally, the bottom of which is in contact with the conductive layer PS, and enclosed in the volume of the pre-metal dielectric region DPM.

For example, the first metal layer CM1 is formed by a thin layer of titanium nitride TiN, or optionally by a superposition of a thin layer of titanium Ti and a thin layer of titanium nitride TiN (it will be noted that strictly speaking, titanium nitride is a ceramic, but is usually considered as a metal compound in the semiconductor and microelectronics industry).

For example, the dielectric layer CD is formed by a metal oxide, advantageously chosen for its high dielectric permittivity (compared to the reference dielectric permittivity of silicon dioxide), such as for example tantalum oxide $Ta_2O_5$, or other metal or silicon oxides or nitrides.

For example, the second metal layer CM2 is formed by a superposition of a thin layer of titanium Ti and a thin layer of titanium nitride TiN (or optionally by a thin layer of titanium nitride TiN alone) and by a body made of metal such as tungsten W.

For example, the conductive layer PS is formed of polycrystalline silicon, and advantageously includes a thin layer of metal silicide SIM, for example cobalt silicide $CoSi_2$, on the upper surface which is in electrical contact with the first metal layer CM1 of the capacitive structures MIMCAP.

For example, the contacts CNT1 include a superposition of a diffusion barrier thin layer and a metal body. The thin diffusion barrier layers are for example made of titanium Ti and titanium nitride TiN, and the body is made of tungsten W.

In fact, the examples given above for the first metal layer CM1 and for the second metal layer CM2 correspond to a use of thin diffusion barrier layers of the metal contacts CNT1, usually intended to limit the diffusion of the metal from the contacts to the materials of the semiconductor part FEOL, while being electrically conductive.

However, the thin diffusion barrier layers advantageously allow to chemically bond the first metal layer CM1 with the thin layer of metal silicide SIM of the conductive polycrystalline silicon layer PS. The chemical bond results from an annealing phase, and allows a better electrical connection.

The use of diffusion barrier materials thus allows to improve the electrical connection of the first metal layer CM1 of the capacitive structures MIMCAP with the conductive layer PS and to enable a stable and controlled capacitive effect.

In particular, the annealing phase after deposition of the thin diffusion barrier layers causes an alloy reaction between the silicon of the metal silicide and the material of the thin diffusion barrier layer (for example titanium). This reaction not only improves the access resistance between the thin diffusion barrier layers and the polycrystalline silicon, but also the reliability of this electrical contact.

The structure is thus produced with less risk of defect at the contacts, and consequently it is not necessary to conventionally connect the first metal layer CM1 of the capacitive structures MIMCAP to a specific metal line. The first metal layer CM1 is indeed directly connected to the conductive layer of polycrystalline silicon PS.

In summary, this allows to simplify, without deteriorating the reliability, the arrangement and manufacture of the various elements, in particular in order to optimize the density of the capacitive structures.

The conductive layer PS can in turn be made, for example, in the same way as a gate of a MOS transistor or as an electrode of a MOS capacitive element, and in this case includes a dielectric interface OX electrically insulating the conductive layer PS and the semiconductor substrate SUB.

In fact, the conductive layer PS and the dielectric interface OX can advantageously be specifically configured to form a capacitive structure of the metal-oxide-semiconductor MOSCAP type with the semiconductor substrate SUB.

In the following, "capacitive structure(s) of the metal-oxide-semiconductor type" may be designated directly by reference to the reference sign "MOSCAP", that is to say by the terms "capacitive structure(s) MOSCAP".

FIGS. 2 to 9 illustrate the results of steps of an exemplary method for manufacturing capacitive structures MIMCAP described in relation to FIG. 1. The elements common to FIG. 1 and FIGS. 2 to 9 bear the same references and will not all be detailed in relation to each figure.

Figure 2:
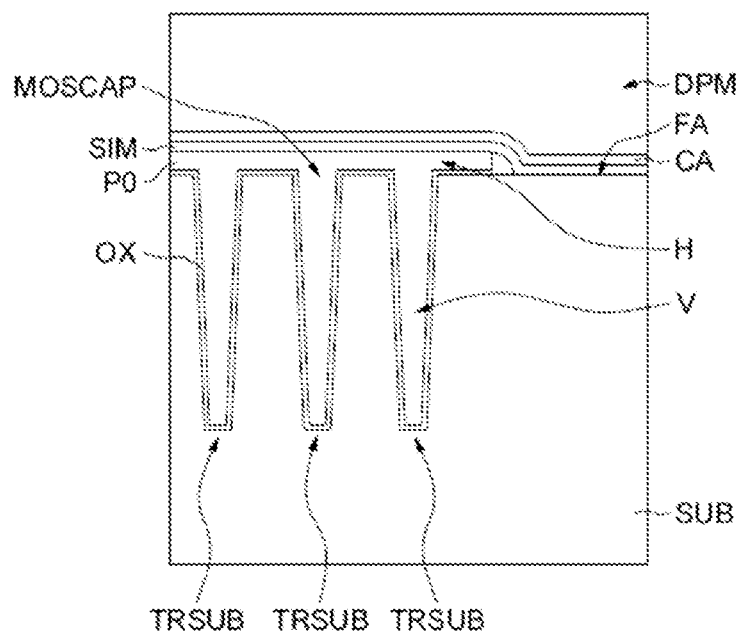
FIGS. 2 to 9 illustrate steps in a method of manufacturing.

FIG. 2 illustrates the result of the manufacturing steps of the semiconductor part FEOL and of the pre-metal dielectric region DPM, in an example of manufacturing an integrated circuit comprising a MOS-type capacitive structure, MOSCAP.

The manufacture of the capacitive structure MOSCAP comprises a formation of the conductive layer P0 on the substrate SUB, in the semiconductor part FEOL, thus configured to form a capacitive structure called metal-oxide-semiconductor capacitive structure MOSCAP, with the semiconductor substrate SUB, The capacitive structure MOSCAP could be planar, as for example shown in FIG. 1, but the example of FIGS. 2 to 9 advantageously corresponds to a capacitive structure MOSCAP wherein the conductive layer P0 includes a horizontal part H covering the front face FA of the substrate SUB and at least one vertical part V extending deep into the substrate SUB, perpendicularly to said front face FA.

In this regard, the formation of the conductive layer P0 comprises an etching of trenches TRSUB extending in the substrate SUB perpendicularly to the front face FA, forming a dielectric interface OX on the front face FA and on the sides and bottoms of the etched trenches TRSUB of the substrate SUB. The dielectric interface OX will thus allow to electrically insulate the capacitive interface between the conductive layer P0 and the semiconductor substrate SUB. The trenches TRSUB are then filled with the conductive material P0, for example polycrystalline silicon, overflowing from the trench TRSUB above a part of said surface FA. The conductive material P0 is then in particular etched through a photolithographed mask so that the conductive layer P0 includes the horizontal part H delimited on the front face FA and the vertical parts V in the trenches TRSUB.

The horizontal part H and the vertical part V thus advantageously belong to a single monolithic structure, that is to say made of a block of a single material. Alternatively, the horizontal part H and the vertical part V can be formed separately and then be electrically connected, thus including a conductive material in the trenches TRSUB separate from the conductive material forming the conductive layer P0 and covering the trenches.

Furthermore, the steps of etching said at least one trench TRSUB and filling said at least one trench TRSUB can advantageously be carried out simultaneously with similar steps of forming a buried access transistor with a vertical gate of a method for manufacturing memory cells of a non-volatile memory.

Indeed, the manufacture of the capacitive structure MOSCAP can be implemented simultaneously with a step of etching trenches of similar structures in a memory region of the semiconductor substrate, and with a step of filling the etched trenches with a conductive material of a vertical gate, of a similar nature, belonging to buried access transistors of non-volatile memory cells. Memory cells typically further comprise a floating gate state transistor coupled in series with the access transistor.

A silicidation of the conductive layer P0 of polycrystalline silicon allows to form a thin layer of metal silicide SIM on the upper surface of the conductive layer P0.

The pre-metal dielectric region DPM is then formed above the conductive layer P0 and the front face FA of the substrate SUB. The formation of the pre-metal dielectric region DPM provides for forming a stop layer AC, for example made of silicon nitride, and forming the pre-metal dielectric volume itself, for example made of phosphosilicate glass or silicon dioxide. The upper part of the pre-metal dielectric region DPM is levelled by mechanical-chemical planarization.

At this stage, the original method for manufacturing the capacitive structure MOSCAP (wherein the manufacture of the capacitive structures MIMCAP is inscribed) would provide for the formation of metal contacts through the pre-metal dielectric region DPM.

Figure 3:
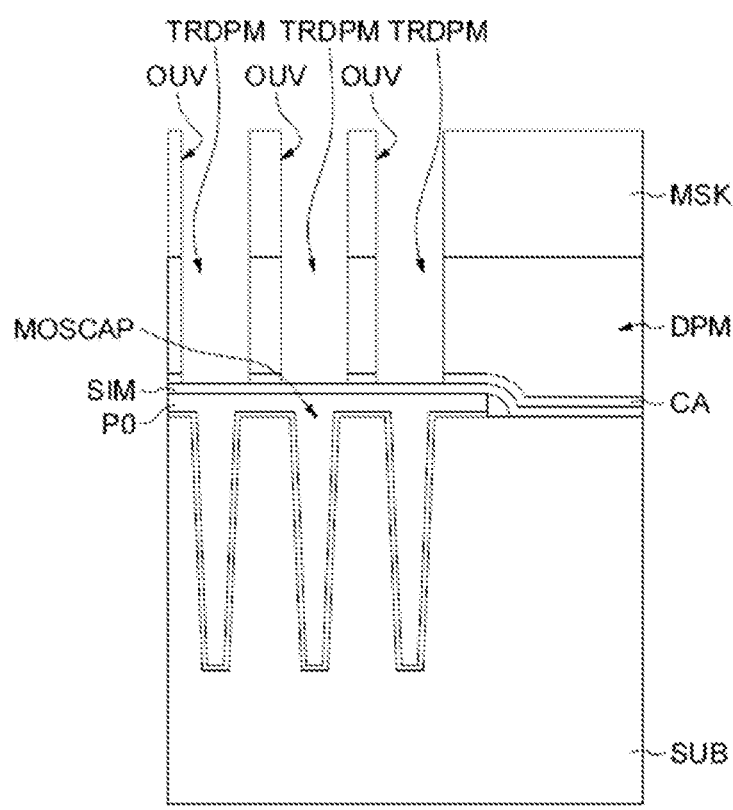

FIG. 3 illustrates the result of an etching step in the pre-metal dielectric layer DPM for the formation of capacitive structures MIMCAP.

A mask MSK having an etching pattern comprising openings OUV obtained by photolithography, is used on the pre-metal dielectric region DPM. The openings OUV have a shape which is elongated in length (perpendicularly to the view of FIG. 3), and are disposed in parallel, spaced in the width direction (horizontally in the view of FIG. 3).

Trenches TRDPM are opened in the volume of the pre-metal dielectric region DPM by means of anisotropic dry etching, for example reactive ion bombardment etching (for example, Reactive Ion Etching (RIE)). The RIE etching is configured to, initially, selectively etch the pre-metal dielectric material DPM, for example made of silicon oxide, and to be stopped by the material of the stop layer CA, located on the conductive layer P0, for example made of silicon nitride. Secondly, the RIE etching is configured to selectively etch the stop layer CA so as to uncover the silicided surface SIM of the conductive layer P0 at the bottom of the trenches TRDPM, and not or very little etch the pre-metal dielectric material DPM, for example made of silicon oxide.

The trenches TRDPM thus open in the volume of the pre-metal dielectric part DPM will accommodate the capacitive structures MIMCAP.

In this example, the trenches TRDPM which are open in the pre-metal dielectric part DPM are aligned with the vertical parts V of the conductive layer P0. This being the case, the trenches TRDPM can be disposed staggered between each vertical part V of the conductive layer P0, or without any particular relationship with the position of the vertical parts V of the conductive layer P0.

Figure 4:
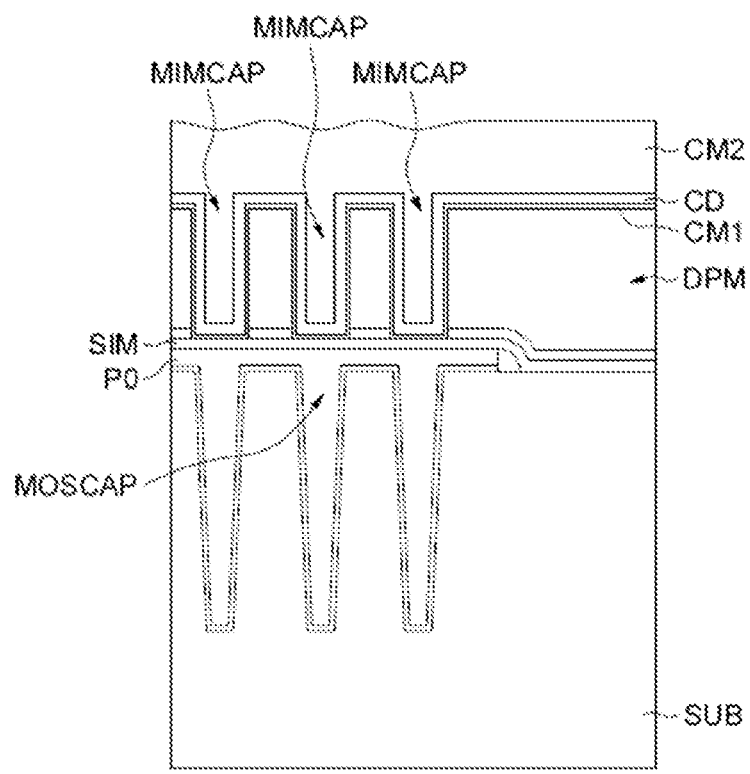

FIG. 4 illustrates the result of steps of forming a superposition of metal, insulating, and metal layers of the capacitive structures MIMCAP, after selectively removing the mask MSK.

A first metal layer CM1 is first deposited in a conformal manner, that is to say conforming, at a substantially constant thickness, to the contour of the structure on which it rests, that is to say on top of the pre-metal dielectric DPM, on the sides of the trenches TRDPM and the bottoms of the trenches TRDPM.

The first metal layer CM1 is thus in contact with the thin layer of metal silicide SIM of the conductive layer P0.

The first metal layer CM1 includes, for example, at least one thin layer of titanium nitride, optionally also a thin layer of titanium.

The formation of the first metal layer CM1 is, for example, made by a Physical Vapor Deposition (PVD) or by a Chemical Vapor Deposition (CVD), including its variants, for example with plasma assistance (PECVD), at low pressure (LPCVD), or by Atomic Layer Deposition (ALD), etc.

The first metal layer CM1 is advantageously formed by a step similar to the formation of a diffusion barrier layer usually provided for metal contacts.

A dielectric layer CD is deposited in a conformal manner, on the first metal layer CM1, and in particular conforms to the sides and the bottoms of the first metal layer CM1 located in the trenches TRDPM.

The dielectric layer CD includes, for example, tantalum oxide or another dielectric material, such as a metal or silicon oxide or nitride.

The formation of the dielectric layer CD is for example carried out by PVD or CVD.

A second metal layer CM2 is deposited so as to excessively stuff the free volume remaining inside the trenches TRDPM. The second metal layer CM2 is thus electrically separated from the first metal layer CM1 by the dielectric layer CD.

Advantageously, the formation of the second metal layer CM2 comprises depositing a thin layer of titanium and a thin layer of titanium nitride, or optionally only a thin layer of titanium nitride, then excessively filling the free volumes remaining inside the trenches TRDPM with a metal, for example tungsten.

The detail of the thin layers of titanium and titanium nitride has not been shown in FIGS. 4 to 9, for reasons of readability of the drawings.

Forming the constituents of the second metal layer CM2 is, for example, carried out by PVD or CVD.

All the constituents of the second metal layer CM2 can advantageously be formed by steps similar to a metal contact formation providing diffusion barrier layers.

Indeed, as mentioned previously in relation to FIG. 2 and as will appear below in relation to FIGS. 7 and 8, the manufacture of the capacitive structures MIMCAP is inscribed in an integrated circuit manufacturing method at the time of formation of the metal contacts. Thus, providing for the formation of the first metal layer CM1 and of the second metal layer CM2 with techniques similar, or even identical, to the techniques used to form the metal contacts, allows, on the one hand, to use known and mastered techniques, and on the other hand, not to considerably modify the course of the integrated circuit production chain. Indeed, the formation of additional capacitive structures MIMCAP can in this case use the same tools and the same reactors as those used in the conventional methods for manufacturing metal contacts.

Figure 5:
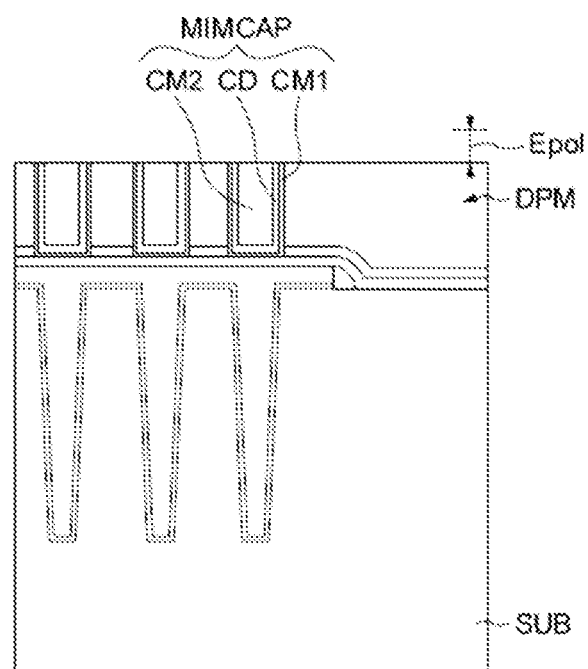

FIG. 5 illustrates the result of a mechanical-chemical planarization step removing the excess from the second metal layer CM2, the dielectric layer CD and the first metal layer CM1 located on top of the pre-metal dielectric DPM. Furthermore, the mechanical-chemical planarization is configured to remove a significant thickness Epol from the upper parts of the pre-metal dielectric region DPM and the capacitive structures MIMCAP in the volume of the pre-metal dielectric region DPM.

Figure 6:
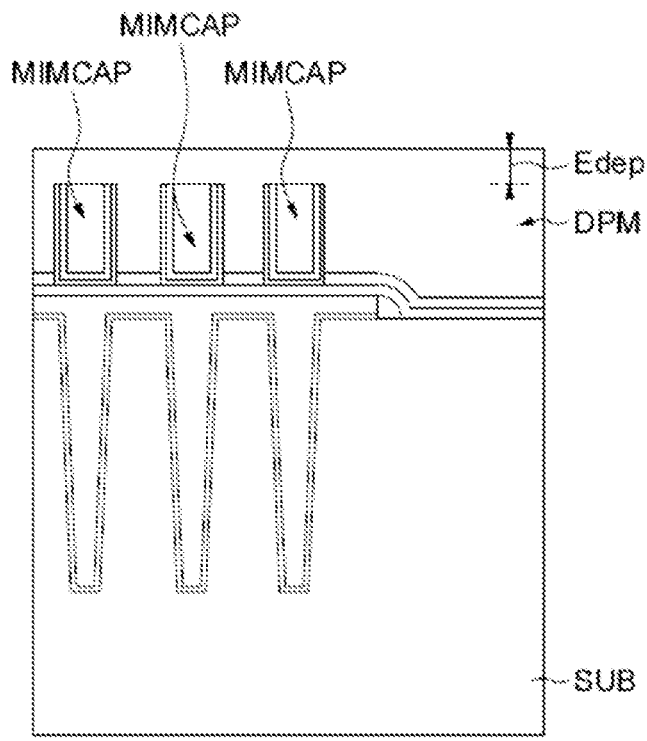

FIG. 6 illustrates the result of a deposition of a thickness Edep of the dielectric material DPM substantially equal to the thickness Epol removed by the mechanical-chemical planarization, to return to the original thickness of the pre-metal dielectric region DPM, that is to say to have substantially the same height as the pre-metal dielectric region obtained in relation to FIG. 2.

Thus, the capacitive structures MIMCAP have a narrow shape in width (horizontally in the view of FIG. 6), elongated in length (perpendicularly to the view of FIG. 6), and a depth (vertically in the view of FIG. 6) starting from a deviation of the thickness Edep from the top of the pre-metal dielectric region DPM, to the conductive layer P0. The thickness deviation Edep will allow to form contacts CNT1 on top of the capacitive structures MIMCAP.

Figure 7:
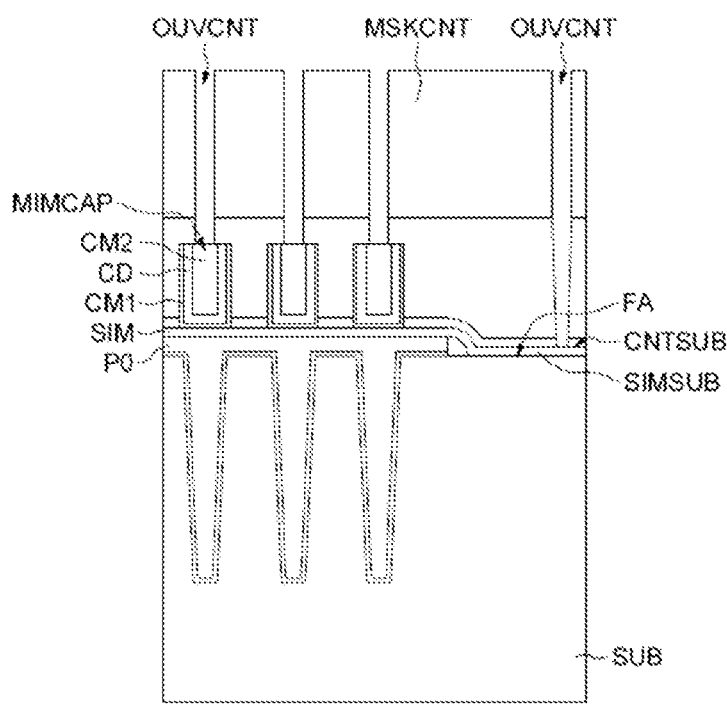

FIG. 7 illustrates a step of etching holes to form the metal contacts, as would be provided in the conventional method, after the step of FIG. 2.

The anisotropic dry etching uses a mask MSKCNT, the pattern of which defines openings OUVCNT facing the second metal layers CM2 of the capacitive structures MIMCAP.

The alignment of the openings can withstand an offset over part of the thickness of the dielectric layer CD, without causing a short circuit between the second metal layer CM2 and the first metal layer CM1.

Indeed, the openings will be enveloped and filled with conductive materials, and providing for a formation of contacts CNT1 to electrically connect the second metal layer CM2 of the capacitive structures MIMCAP, advantageously allows to avoid forming a short-circuit between the first metal layer CM1 and the second metal layer CM2.

However, alternatives to the steps described in relation to FIG. 4 or 5 could provide for electrically insulating the first metal layer CM1 and the second metal layer CM2 on the upper part of the capacitive structures MIMCAP. For example, the mechanical-chemical planarization, on the structure of FIG. 4, could be stopped by the horizontal part of the dielectric layer CD. A free opening would thus be obtained on the top of the second metal layer CM2, but the first metal layer CM1 would remain covered by the dielectric layer CD. In this case, the second metal layer CM2 could be directly electrically contacted at its free opening by the metal track PM1, without risk of a short-circuit with the first metal layer CM1. The parts located outside the production of the capacitive element MIMCAP of the stack of the first metal layer CM1, of the dielectric layer CD and of the second metal layer CM2, could moreover be etched.

Other openings OUVCNT are moreover positioned opposite other locations of the part FEOL to be contacted, for example on a thin layer of metal silicide SIMSUB of a contact point CNTSUB on the front face FA of the substrate SUB, or on the thin layer of metal silicide of the conductive layer P0 (not visible in FIG. 7).

Figure 8:
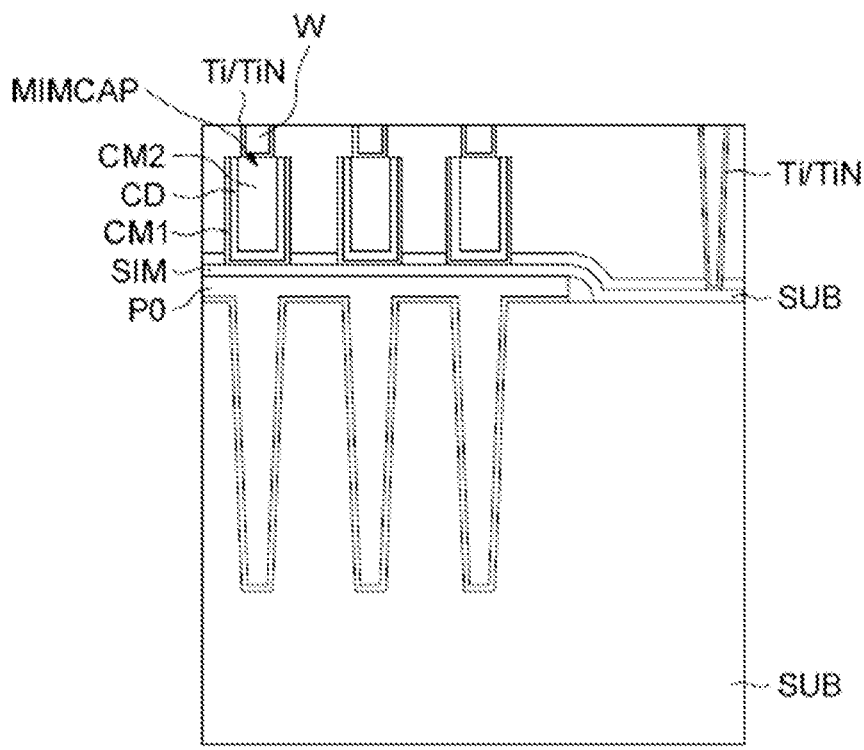

FIG. 8 illustrates the result of a formation of a metal contact diffusion barrier layer, for example a superposition of a thin layer of titanium and a thin layer of titanium nitride Ti/TiN, on the sides and the bottoms of the openings OUVCNT.

At this point in the method, a step of "filling with the barrier layer" (terms taken from the usual expression "barrier filling"), is advantageously implemented, for example by means of a non-oxidizing annealing. The step of filling with the barrier layer "barrier filling" allows to form an alloy between the material of the thin diffusion barrier layers, such as titanium, with the materials of the surfaces to be contacted, such as the silicon of the metal silicide SIM in order to strengthen the electrical contact between these layers.

Thus, the step of filling with the barrier layer "barrier filling" improves in particular the electrical connection of the first metal layer CM1 of the capacitive structures MIMCAP with the thin layer of metal silicide SIM of the conductive layer made of polycrystalline silicon P0.

Then, the metal body W of the contacts CNT1, CNT3 (FIG. 9) is formed, for example by means of an excess deposition of the metal W, typically tungsten, and of a levelling by mechanical-chemical planarization until reaching the top of the pre-metal dielectric region DPM.

Figure 9:
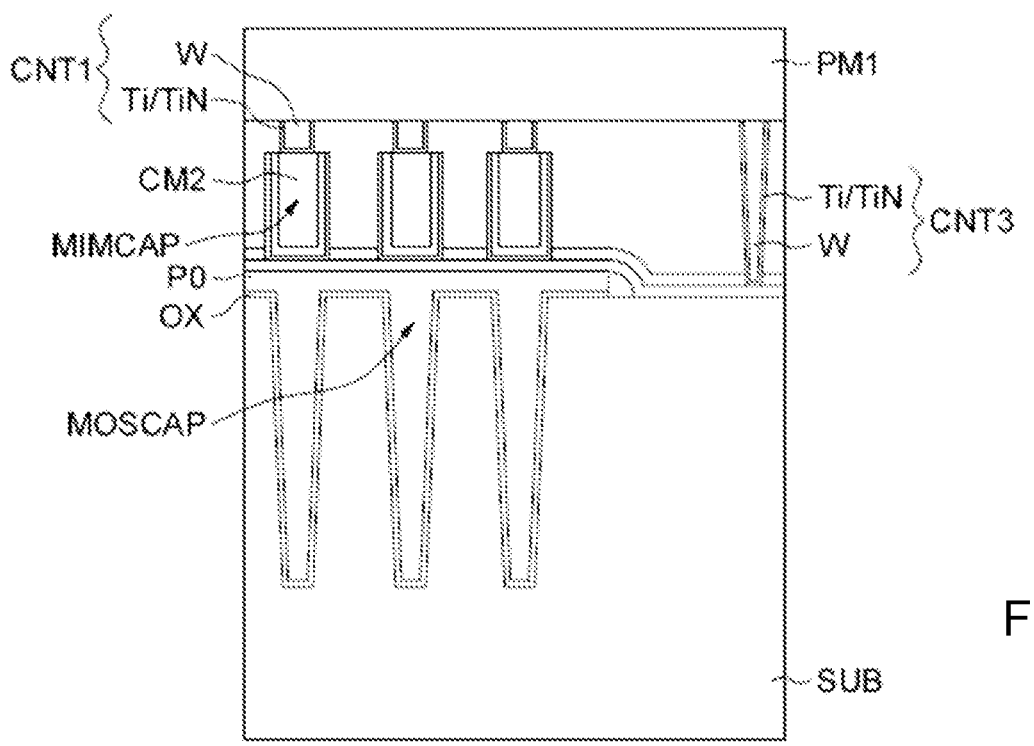

FIG. 9 shows the result of the formation of the first metal level M1.

The first metal level M1 comprises in this example a metal track PM1 electrically connecting the second metal layers CM2 of the capacitive structures MIMCAP together via first contacts CNT1, and also the substrate SUB via another contact CNT3.

Thus, in addition to the first capacitive interface of the capacitive structure MOSCAP between the conductive layer P0 and the substrate SUB, an additional capacitive interface between the conductive layer P0 and the substrate SUB is provided, via the metal track PM1, by the capacitive structures MIMCAP, without taking up additional space on the substrate SUB.

Figure 10:
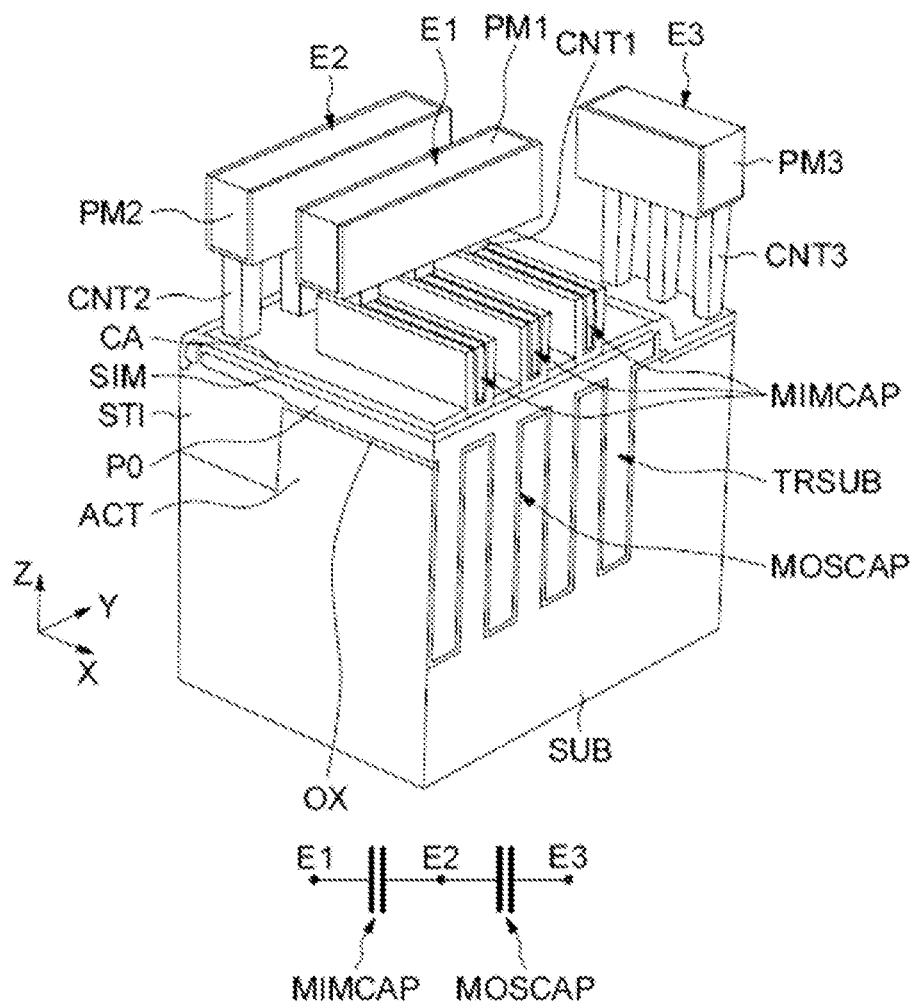
FIG. 10 illustrates in a perspective view the structure obtained by a method of the type of that described above in relation to FIGS. 2 to 9.

FIG. 10 illustrates in a perspective view the structure obtained by a method of the type of that described above in relation to FIGS. 2 to 9, wherein the pre-metal dielectric region is made transparent.

Figure 11:
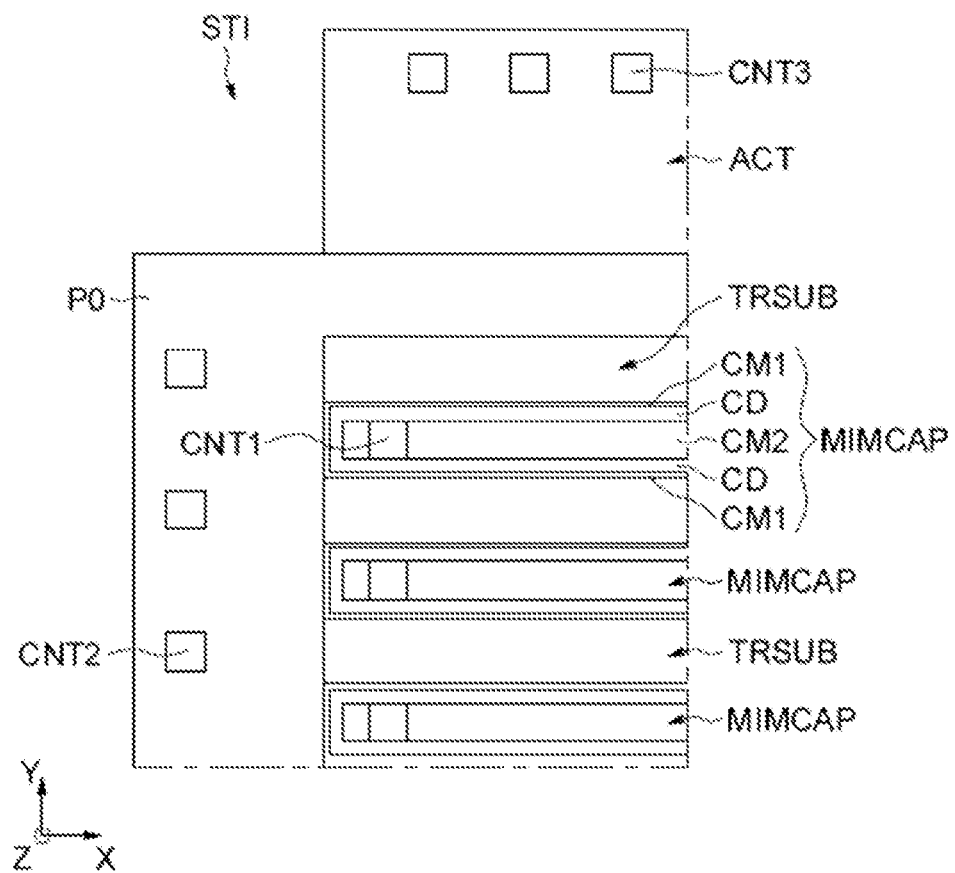
FIG. 11 illustrates a top view of the structure of FIG. 10.

FIG. 11 illustrates a top view of the structure of FIG. 10. The stacked elements are represented by transparency.

A coordinate system X, Y, Z orients the space wherein FIGS. 10 and 11 are represented, the horizontal mentioned above being located in the plane XY longitudinally in the direction X and laterally in the direction Y, the vertical is directed by the direction Z. FIGS. 1 to 9 are thus represented in the plane YZ of this orientation.

The elements described above in relation to FIG. 1 and FIGS. 2 to 9 bear the same references and will not all be detailed again.

This being the case, in the example of FIGS. 10 and 11, on the one hand, the capacitive structures MIMCAP are not aligned above the trenches TRSUB of the capacitive element MOSCAP, but are positioned opposite the spaces located between each trench TRSUB of the capacitive element MOSCAP.

On the other hand, it will be noted that a first metal track PM1 of the first metal level M1 is connected via first contacts CNT1 with the second metal layer CM2 of the capacitive structures MIMCAP. A second metal track PM2 of the first metal level M1 is connected via second contacts CNT2 with the conductive layer P0. A third metal track PM3 of the first metal level M1 is connected via third contacts CNT3 with a region called the active region ACT of the substrate, containing the capacitive structure MOSCAP, and typically delimited by shallow insulation regions STI.

Thus, the first metal track PM1 constitutes a terminal of a first capacitive electrode E1, the second metal track PM2 constitutes a terminal of a second capacitive electrode E2, and the third metal track PM3 constitutes a terminal of a third capacitive electrode E3.

The capacitive structure MIMCAP includes the first electrode E1 and the second electrode E2, and the capacitive structure MOSCAP includes the second electrode E2 and the third electrode E3.

In an equivalent electrical diagram, the capacitive structure MIMCAP and the capacitive structure MOSCAP are connected to the second common electrode E2.

Consequently, by connecting the first electrode E1 together with the third electrode E3, a parallel assembly of the capacitive structure MIMCAP and the capacitive structure MOSCAP is obtained. It is also possible to short-circuit the capacitive structure MIMCAP by connecting the first electrode E1 together with the second electrode E2 to use only the capacitive structure MOSCAP, or to short-circuit the capacitive structure MOSCAP by connecting the second electrode E2 together with the third electrode E3 to use only the capacitive structure MIMCAP.

In other words, this allows to modulate the capacitive value of the circuit, by choosing to use either one or the combination of the two capacitive structures MIMCAP, MOSCAP.

Finally, it will be noted that in the example of FIGS. 10 and 11, a longitudinal end of the capacitive structures MIMCAP is located substantially opposite the delimitation of the active region ACT by the insulation trenches STI. The first contacts CNT1 are thus located towards the inside of the active region ACT, while the second contacts CNT2 are located towards the outside of the active region ACT, above the insulation trenches STI.

Figure 12:
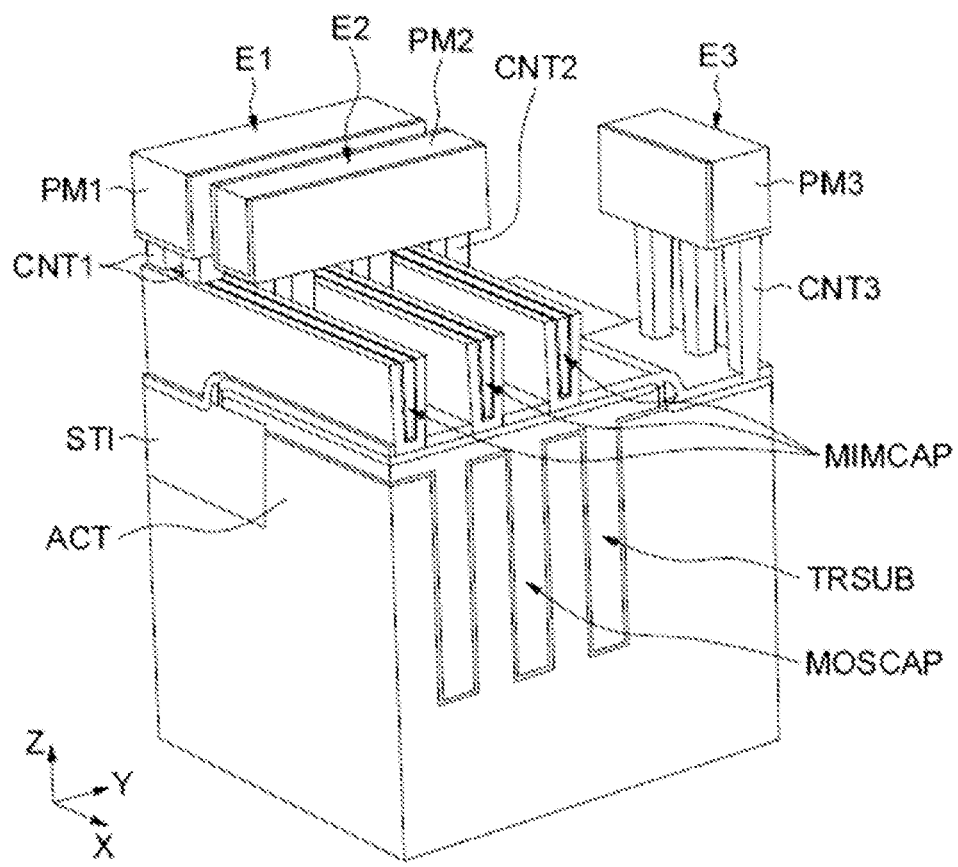
FIGS. 12 and 13 illustrate perspective and top views, respectively, of an alternative to the structure of the integrated circuit illustrated by FIGS. 10 and 11.
Figure 13:
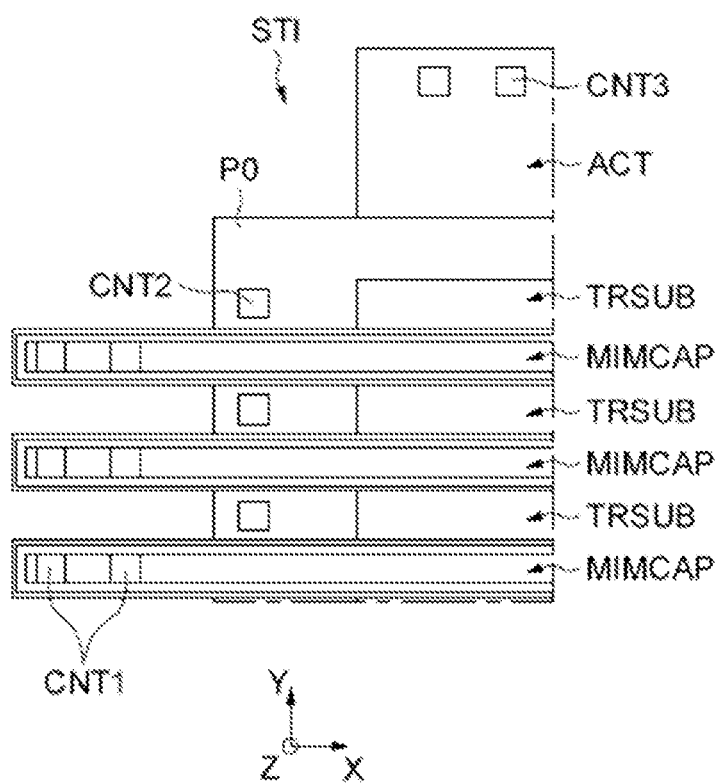

FIGS. 12 and 13 illustrate an alternative to the structure of the integrated circuit illustrated by FIGS. 10 and 11.

In this alternative, the capacitive structures MIMCAP are extended longitudinally towards the outside of the active region ACT, above the insulation trenches STI. The first contacts CNT1 are thus located outside the conductive layer P0, while the second contacts CNT2 are located between the first contacts CNT1 and the active region ACT, above the insulation trenches STI. The second contacts CNT2 are positioned in the lateral spaces between the capacitive structures MIMCAP.

This allows in particular to increase the length of the capacitive structures MIMCAP and thus to increase the capacitive value of the capacitive structure MIMCAP.

The other elements of the integrated circuit are identical to the example illustrated in FIGS. 10 and 11.

Figure 14:
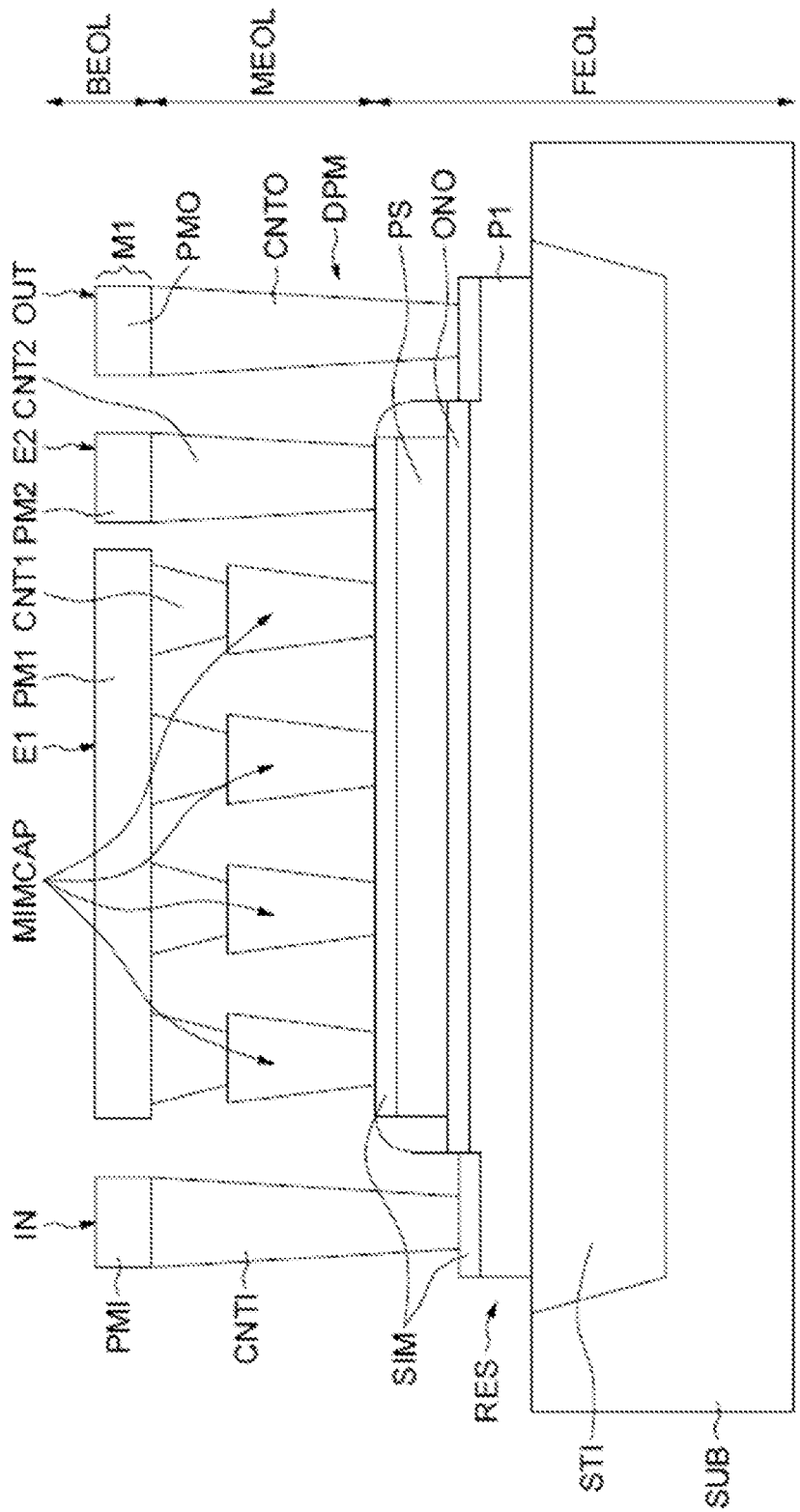
FIG. 14 illustrates application of capacitive structures described in relation to FIG. 1 in the context of manufacturing a resistive-capacitive RC circuit.

FIG. 14 illustrates an example of application of capacitive structures MIMCAP of the metal-dielectric-metal "MIM" type, described in relation to FIG. 1, in the context of manufacturing a resistive-capacitive RC circuit. The common elements described previously in relation to FIG. 1 bear the same references and will not all be detailed again.

In this example, the conductive layer PS of the semiconductor part FEOL rests on another conductive layer P1, called resistive conductor bar P1 and belonging to a resistive element RES.

The resistive conductor bar P1 is, for example, also made of polycrystalline silicon, and is formed on an insulation region STI, for example of the shallow insulation trench type.

The resistive semiconductor bar P1 is configured to have a resistive value and includes two open ends. The open ends include a thin layer of metal silicide SIM electrically coupled to metal tracks PMI, PMO of the first metal level M1 via respective contacts CNTI, CNTO. The metal tracks PMI, PMO thus materialize the terminals IN, OUT of the resistive element RES.

The conductive layer PS is electrically insulated from the resistive conductor bar P1 by a dielectric thickness ONO, including for example a superposition of oxide, nitride and silicon oxide layers.

Advantageously, the manufacture in particular of the resistive conductor bar P1, of the dielectric thickness ONO and of the conductive layer PS can be carried out in the manner of manufacturing floating-gate transistors, or even simultaneously during the same steps of the manufacturing method.

From this production of the semiconductor part FEOL, the capacitive structures MIMCAP are manufactured in the pre-metal dielectric region DPM by means of a method of the type of the method described above in relation to FIGS. 3 to 9.

Thus, by electrically coupling the first electrode E1 of the capacitive structures MIMCAP with a terminal OUT of the resistive element RES, called the output terminal, and by electrically coupling the second terminal E2 of the capacitive structures MIMCAP with a reference potential (that is to say the ground), one obtains the assembly of the electrical diagram of the RC series resistive-capacitive circuit of FIG. 14. The output terminal OUT forms the output of the RC series resistive-capacitive circuit while the other terminal IN of the resistive element RES forms the input of the RC series resistive-capacitive circuit.

This being the case, by coupling the first electrode E1 of the capacitive structures MIMCAP with the terminal IN of the resistive element RES and by electrically coupling the second electrode E2 of the capacitive structures MIMCAP with the terminal OUT of the resistive element RES, the parallel resistive-capacitive circuit assembly is obtained.

Consequently, resistive-capacitive RC circuits including a resistive element RES and a capacitive element MIMCAP, can be produced on a surface of the substrate SUB not larger than the surface occupied by the resistive element RES alone, thanks to the advantageous production of the capacitive structure MIMCAP in the volume of the pre-metal dielectric region.

Moreover, the invention is not limited to the embodiment and implementation described in relation to FIGS. 1 to 14, but embraces all the variants, for example the materials chosen may be different from the examples given above, or else the elements of the semiconductor region FEOL located under the conductive layer PS, P0 may be different and applied to other electrical assemblies.

The invention claimed is:

1. An integrated circuit, comprising:
   a semiconductor substrate;
   a conductive layer above a front face of the semiconductor substrate;
   a stack of metal levels including a first metal level located closest to the semiconductor substrate, said first metal level including a first metal track;
   a dielectric region located between the conductive layer and the first metal level of said stack of metal levels; and
   at least one metal-insulator-metal capacitive structure located in a trench opening within the dielectric region, comprising:
     a first metal layer configured to be electrically connected with the conductive layer,
     a second metal layer configured to be electrically connected with the first metal track in the first metal level, and
     a dielectric layer between the first metal layer and the second metal layer;
   a dielectric interface that electrically insulates between the conductive layer and the semiconductor substrate, wherein the conductive layer and the dielectric interface are configured to form, with the semiconductor substrate, a capacitive structure of a metal-oxide-semiconductor type; and
   wherein the conductive layer is electrically connected to a second metal track of the first metal level, and wherein the semiconductor substrate is electrically connected to a third metal track of the first metal level, and wherein the second metal track and the third metal track are electrically connected with each other.

2. The integrated circuit according to claim 1, wherein the conductive layer is made of polycrystalline silicon and comprises a layer of metal silicide, and wherein the first metal layer comprises a diffusion barrier layer in chemical bond with the layer of metal silicide.

3. The integrated circuit according to claim 1, wherein the first metal layer of said at least one metal-insulator-metal capacitive structure conforms to sides and a bottom of the trench opening, wherein the dielectric layer conforms to a surface of the first metal layer, and wherein the second metal layer conforms to a surface of the dielectric layer.

4. The integrated circuit according to claim 1, wherein the conductive layer includes a horizontal part covering a surface of the semiconductor substrate and at least one vertical part extending in depth into the semiconductor substrate perpendicular to said surface.

5. The integrated circuit according to claim 4, wherein the at least one vertical part of the conductive layer has a structure corresponding to a structure of a vertical gate of a buried access transistor belonging to a memory cell of a non-volatile memory.

6. The integrated circuit according to claim 1, further comprising a resistive conductive bar belonging to a resistive element having two terminals, wherein the conductive layer is located above the resistive conductive bar, and wherein the first metal track, the conductive layer, and the two terminals of the resistive element are electrically connected to form a resistive-capacitive circuit with said at least one capacitive structure of the metal-insulator-metal type.

7. An integrated circuit, comprising:
   a semiconductor substrate;
   a conductive layer above a front face of the semiconductor substrate;
   a stack of metal levels including a first metal level located closest to the semiconductor substrate, said first metal level including a first metal track;
   a dielectric region located between the conductive layer and the first metal level of said stack of metal levels; and
   at least one metal-insulator-metal capacitive structure located in a trench opening within the dielectric region, comprising:
     a first metal layer configured to be electrically connected with the conductive layer,
     a second metal layer configured to be electrically connected with the first metal track in the first metal level, and
     a dielectric layer between the first metal layer and the second metal layer;
   a dielectric interface that electrically insulates between the conductive layer and the semiconductor substrate, wherein the conductive layer and the dielectric interface are configured to form, with the semiconductor substrate, a capacitive structure of a metal-oxide-semiconductor type; and
   wherein the conductive layer is electrically connected to a second metal track of the first metal level, and wherein the semiconductor substrate is electrically connected to a third metal track of the first metal level, and wherein the second metal track and the third metal track are electrically connected to the first metal track.

8. The integrated circuit according to claim 7, wherein the conductive layer is made of polycrystalline silicon and comprises a layer of metal silicide, and wherein the first metal layer comprises a diffusion barrier layer in chemical bond with the layer of metal silicide.

9. The integrated circuit according to claim 7, wherein the first metal layer of said at least one metal-insulator-metal capacitive structure conforms to sides and a bottom of the trench opening, wherein the dielectric layer conforms to a surface of the first metal layer, and wherein the second metal layer conforms to a surface of the dielectric layer.

10. The integrated circuit according to claim 7, wherein the conductive layer includes a horizontal part covering a surface of the semiconductor substrate and at least one vertical part extending in depth into the semiconductor substrate perpendicular to said surface.

11. The integrated circuit according to claim 10, wherein the at least one vertical part of the conductive layer has a structure corresponding to a structure of a vertical gate of a buried access transistor belonging to a memory cell of a non-volatile memory.

12. The integrated circuit according to claim 7, further comprising a resistive conductive bar belonging to a resistive element having two terminals, wherein the conductive layer is located above the resistive conductive bar, and wherein the first metal track, the conductive layer, and the two terminals of the resistive element are electrically connected to form a resistive-capacitive circuit with said at least one capacitive structure of the metal-insulator-metal type.

13. An integrated circuit, comprising:
a front end of line part including a semiconductor substrate having a front face and a conductive layer over the front face;
a middle end of line part including a dielectric region located over said front end of line part;
a back end of line part including a stack of metal levels located over said middle end of line part, said stack of metal levels comprising a first metal level located closest to the semiconductor substrate;
wherein said dielectric region of the middle end of line part includes a plurality of trench openings extending through the dielectric region of the middle end of line part to an upper surface of the conductive layer;
a metal-insulator-metal capacitive structure located in each trench opening, wherein each metal-insulator-metal capacitive structure comprises: a first metal layer lining side walls and a bottom of each trench opening and further in electrical contact with the upper surface of the conductive layer; a dielectric layer on the first metal layer; and a second metal layer on the dielectric layer;
an electrical connection of the second metal layer of each metal-insulator-metal capacitive structure to the first metal level of the back end of line part;
a resistive track between said front face and the conductive layer; and
an insulating layer between the resistive track and the conductive layer;
said resistive track having first and second terminals, wherein said first terminal is electrically connected to each metal-insulator-metal capacitive structure.

14. The integrated circuit of claim 13, wherein said conductive layer comprises: a polysilicon layer; and a silicide layer; wherein said first metal layer is in electrical contact with the silicide layer.

15. The integrated circuit of claim 14, further comprising a further dielectric layer between the polysilicon layer and the upper surface of the semiconductor substrate; wherein said polysilicon layer, further dielectric layer and semiconductor substrate form a capacitive structure of a metal-oxide-semiconductor type.

16. The integrated circuit of claim 15, wherein the semiconductor substrate includes a substrate trench extending into the semiconductor substrate from the upper surface, and wherein the conductive layer includes a horizontal part extending over the upper surface of the semiconductor substrate and a vertical part within said substrate trench.

17. The integrated circuit of claim 16, wherein said further dielectric layer lines sidewalls and a bottom of the substrate trench.

* * * * *